US008704199B2

(12) United States Patent
Klaassen et al.

(10) Patent No.: US 8,704,199 B2
(45) Date of Patent: Apr. 22, 2014

(54) ALIGNMENT OF COLLECTOR DEVICE IN LITHOGRAPHIC APPARATUS

(75) Inventors: Michel Fransois Hubert Klaassen, Eindhoven (NL); Jan Bernard Plechelmus Van Schoot, Eindhoven (NL); Sylvain Dutartre, Montigny le Bretonneux (FR)

(73) Assignee: ASML Netherlands B.V., Veldhoven (NL)

( * ) Notice: Subject to any disclaimer, the term of this patent is extended or adjusted under 35 U.S.C. 154(b) by 402 days.

(21) Appl. No.: 13/002,544

(22) PCT Filed: Jul. 15, 2009

(86) PCT No.: PCT/EP2009/059048
§ 371 (c)(1),
(2), (4) Date: Mar. 3, 2011

(87) PCT Pub. No.: WO2010/012589
PCT Pub. Date: Feb. 4, 2010

(65) Prior Publication Data
US 2011/0188018 A1 Aug. 4, 2011

Related U.S. Application Data

(60) Provisional application No. 61/084,759, filed on Jul. 30, 2008.

(51) Int. Cl.
*H05G 2/00* (2006.01)
*G03B 27/54* (2006.01)
*G03F 7/20* (2006.01)

(52) U.S. Cl.
CPC .......... *G03F 7/70033* (2013.01); *G03F 7/7085* (2013.01)
USPC ........................................ 250/504 R; 355/67

(58) Field of Classification Search
CPC ............ G03F 7/70008; G03F 7/70025; G03F 7/70033; G03F 7/7005; G03F 7/70591; G03F 7/7085; G03F 19/0019; G03F 19/0095; G03F 19/0047; H05G 2/00
USPC ................... 355/67–71; 250/504 R
See application file for complete search history.

(56) References Cited

U.S. PATENT DOCUMENTS 7,276,710 B2 * 10/2007 Yamamoto et al. ........ 250/492.2
7,459,707 B2 * 12/2008 Kanazawa ................ 250/504 R
(Continued)

FOREIGN PATENT DOCUMENTS

| EP | 1 605 312 A1 | 12/2005 |
| JP | 2007109451 A * | 4/2007 |
| WO | WO 2007/054291 A1 | 5/2007 |

OTHER PUBLICATIONS

International Search Report directed to related International Patent Application No. PCT/EP2009/059048, mailed Oct. 14, 2009, from the European Patent Office; 3 pages.
International Preliminary Report on Patentability and Written Opinion of the International Searching Authority directed to realted International Patent Application No. PCT/EP2009/05948, mailed Feb. 1, 2011, from the International Bureau of WIPO; 9 pages.

(Continued)

*Primary Examiner* — Steven H Whitesell Gordon
(74) *Attorney, Agent, or Firm* — Sterne, Kessler, Goldstein & Fox P.L.L.C.

(57) ABSTRACT

A lithographic apparatus (2) can include a radiation source (SO) configured to provide radiation (200), a radiation collector (CO) configured to collect radiation (200) from the radiation source (SO), an illumination system (IL), and a detector (300). The detector (300) can be disposed in a fixed positional relationship with the illumination system (IL) relative to an alignment of the collector (CO). Further, a region (310) of the collector (CO) can be configured to direct a portion of radiation (200) emanating from the radiation source (SO) and traversing the region (310) towards the detector (300). The detector (300) can be configured to detect a change in a portion of the radiation (200). The change can be indicative of a change in position or orientation of the collector (CO) relative to the illumination system (IL) relative to an alignment of the collector (CO).

19 Claims, 5 Drawing Sheets

(56) References Cited

U.S. PATENT DOCUMENTS

Figure 1:
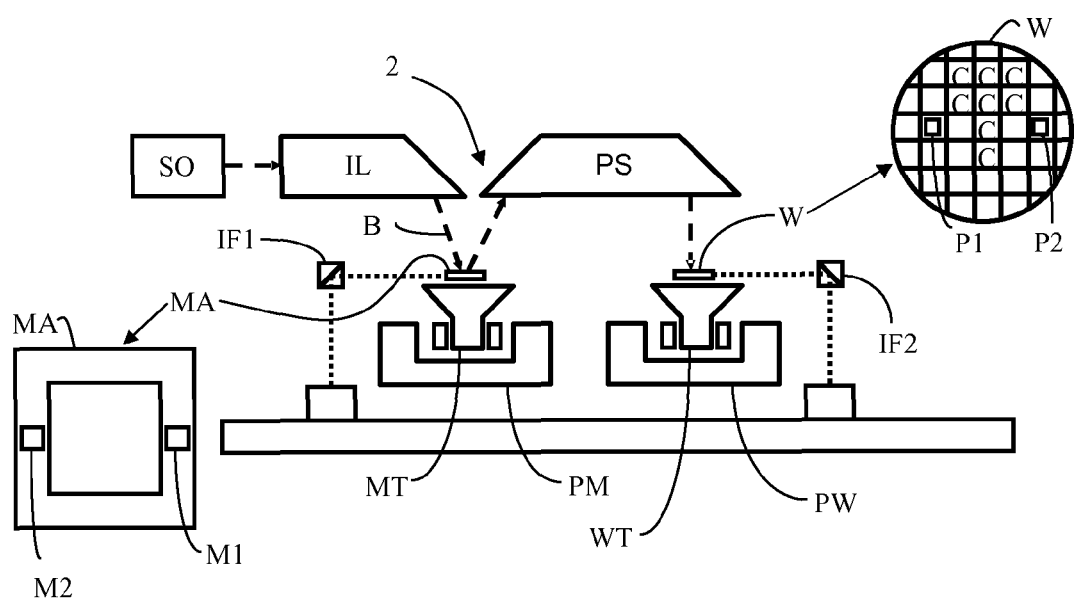

| | | |
|---|---|---|
| 7,875,865 B2 | 1/2011 | Scholz et al. |
| 2005/0270511 A1 | 12/2005 | Dierichs et al. |
| 2005/0274897 A1 | 12/2005 | Singer et al. |
| 2006/0002113 A1 | 1/2006 | Chandhok et al. |
| 2006/0192156 A1* | 8/2006 | Hasegawa ............ 250/504 R |
| 2006/0289808 A1 | 12/2006 | Partlo et al. |
| 2008/0049206 A1 | 2/2008 | Ossmann |
| 2011/0122389 A1 | 5/2011 | Klaassen et al. |

OTHER PUBLICATIONS

International Search Report directed to related International Patent Application No. PCT/EP2009/059045, mailed Oct. 26, 2009, from the European Patent Office; 3 pages.

International Preliminary Report on Patentability and Written Opinion of the International Searching Authority directed to related International Patent Application No. PCT/EP2009/059045, mailed Feb. 1, 2011, from the International Bureau of WIPO; 10 pages.

* cited by examiner

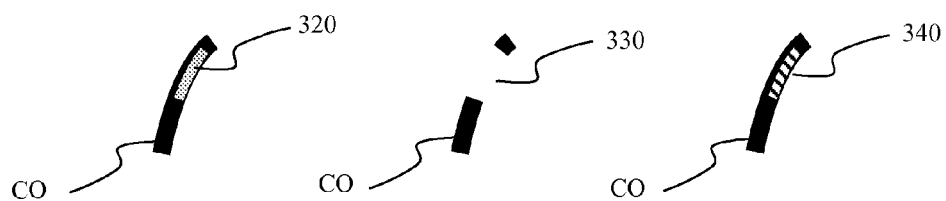
FIG. 5a  FIG. 5b  FIG. 5c
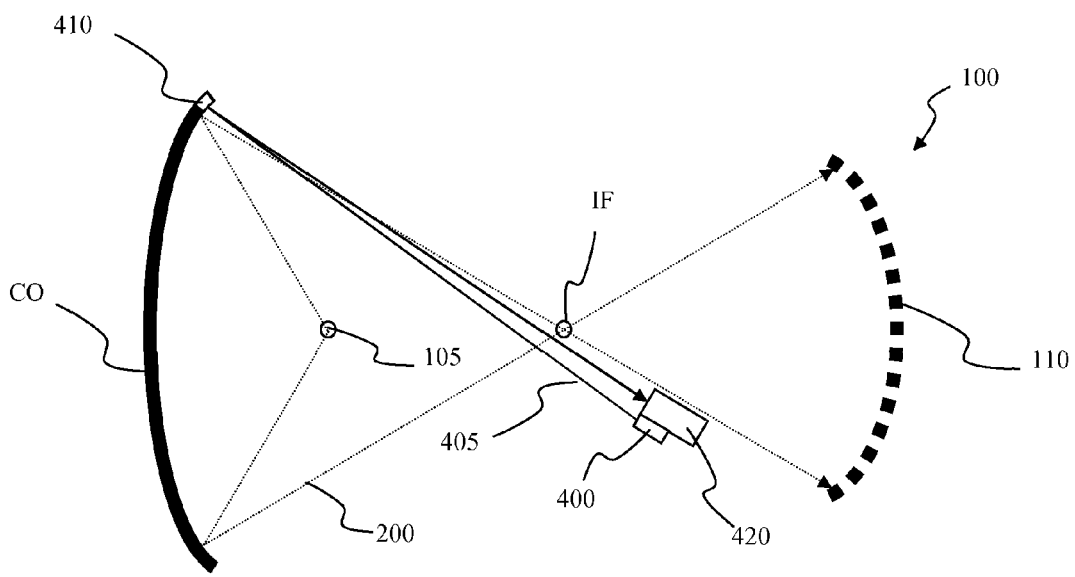
FIG. 6

ALIGNMENT OF COLLECTOR DEVICE IN LITHOGRAPHIC APPARATUS

BACKGROUND

1. Field

The present invention generally relates to the field of lithography tools and, more particularly, to alignment of a collector device in a lithographic apparatus.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., one or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Known lithographic apparatus can include so-called "steppers," in which each target portion is irradiated by exposing an entire pattern onto the target portion at one time and so-called "scanners," in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In order to be able to project ever smaller structures onto substrates, it has been proposed to use extreme ultraviolet radiation (EUV) having a wavelength, for example, within a range of about 13-14 nm. It has further been proposed that radiation with a wavelength of less than about 10 nm could be used (e.g., about 6.7 nm or 6.8 nm). In the context of lithography, wavelengths of less than about 10 nm are sometimes referred to as "beyond EUV" or as "soft x-rays."

Extreme ultraviolet radiation and beyond EUV radiation can be produced using, for example, a plasma. The plasma can be created for example by directing a laser at particles of a suitable material (e.g., tin), or by directing a laser at a stream of a suitable gas or vapor (e.g., Xe gas or Li vapor). The resulting plasma emits EUV (or beyond EUV radiation), which is collected using a collector such as a focusing mirror or a grazing incidence collector.

The orientation and/or position of the collector will determine the direction in which radiation is directed from the collector (e.g., reflected from the collector). Radiation will need to be accurately directed to different parts of the lithographic apparatus, and it is therefore important for the collector to direct radiation in a specific direction. When a lithographic apparatus is constructed and used for the first time, it may be possible to ensure that the collector directs radiation in such specific direction. However, over time it can be difficult to ensure that the radiation beam is always directed in this specific direction. For instance, movement of parts of the lithographic apparatus (e.g., parts of the radiation source) can shift the direction of radiation. Additionally or alternatively, when parts of the lithographic apparatus are replaced (e.g., for maintenance purposes) even a slight misalignment of replacement parts can shift the direction of radiation. It is therefore desirable to align or re-align a collector of a radiation source and parts of the lithographic apparatus located further along the path of the radiation beam. Since an illuminator (hereinafter also referred to as an "illumination system" or "illumination arrangement") is a part of the lithographic apparatus that receives radiation directed by the collector, it is desirable to align or re-align the collector of the radiation source with respect to the illuminator.

A proposed method of aligning the collector with respect to the illuminator involves attaching light emitting diodes (LEDs) to the collector. A measurement of radiation emitted by the LEDs can be used to determine an orientation (e.g., tilt) and/or position of the collector with respect to a default (or reference) position. However, an issue with this method is that the LEDs may not be robust to withstand a harsh environment surrounding the collector. For instance, high temperatures and prolonged exposure to EUV radiation can quickly damage or destroy the LEDs. Furthermore, the LEDs must be attached to the collector with a high degree of accuracy, with little or no drift in the position of the LEDs over time. Given these conditions, an LED-based implementation is difficult to achieve A lithographic apparatus and method for alignment of a collector device with respect to an illuminator device is needed to solve the aforementioned issues.

SUMMARY

According to an embodiment of the present invention, an arrangement for a lithographic apparatus can include the following: a radiation source for providing radiation; a radiation collector for collecting radiation from the radiation source; an illumination system configured to condition radiation collected by the collector and to provide a radiation beam; wherein the lithographic apparatus can include: a detector, the detector being disposed in a fixed positional relationship with a part of the illumination system relative to which the collector is to be aligned, and a region of the collector configured to direct a portion of radiation emanating from the radiation source and traversing the region toward the detector, the detector being arranged to detect a change of a characteristic of the portion of radiation, such a change being indicative of a change in a position or orientation of the collector relative to the part of the illumination system relative to which the collector is to be aligned.

Radiation collected by the collector can traverse a collector surface having a reflectivity, and the region may be, or may be provided with at least one of the group that includes a surface having an increased reflectivity relative to the reflectivity, a surface having a reduced reflectivity relative to the reflectivity, an aperture, or a pattern.

The region can have a surface which has a shape (or topography) different from a shape (or topography) of the surface of the collector such as, for example, to re-direct radiation in a different direction. The region can be a part of the collector, or may be attached to the collector.

The detector can be attached to the illumination system, located on or within the illumination system, attached to a part of the illumination system relative to which the collector is to be aligned, or located on or within a part of the illumination system relative to which the collector is to be aligned.

The illumination system can be provided with an optical element, where the optical element can include raster elements for dividing a radiation beam impinging on those elements, and wherein the detector is attached to the optical element, or forms part of the optical element.

The arrangement for the lithographic apparatus can also include a plurality of detectors like aforementioned detector and arranged to function similar to aforementioned detector.

The region of the collector can be arranged to affect an intensity profile of the radiation directed towards the detector or to affect the direction in which radiation is directed towards the detector. The region of the collector can be arranged to affect the radiation directed towards the detector when the position or orientation of the collector changes with respect to a part of the illumination system relative to which the collector is to be aligned.

According to another embodiment of the present invention, an arrangement for a lithographic apparatus can include the following: a radiation source for providing radiation; a radiation collector for collecting radiation from the radiation source; an illumination system configured to condition radiation collected by the collector and to provide a radiation beam; wherein the arrangement can include: a detector, the detector being disposed in a fixed positional relationship with a part of the illumination system relative to which the collector is to be aligned; and, a further radiation source arranged to direct corresponding further radiation towards a region of the collector, the region being configured to direct the further radiation towards the detector, the detector being arranged to detect a change of a characteristic of the further radiation reflected from the region, such a change being indicative of a change in the position or orientation of the collector relative to the part of the illumination system with respect to which the collector is to be aligned. More than one region can be provided.

The further radiation source can be attached to the illumination system, located on or within the illumination system, attached to a part of the illumination system relative to which the collector is to be aligned, or located on or within a part of the illumination system relative to which the collector is to be aligned.

The lithographic apparatus of the arrangement can further include the following: a support constructed to support a patterning device, the patterning device capable of imparting the radiation beam with a pattern in its cross-section to form a patterned radiation beam; a substrate table constructed to hold a substrate; and, a projection system configured to project the patterned radiation beam onto a target portion of the substrate.

According to yet another embodiment of the present invention, a method of aligning the collector and the part of the illumination system of the arrangement can include the following: detecting radiation directed from the region with which the collector is provided; determining from that detection whether the collector is aligned with the part of the illumination system; and, if the collector is not aligned with the part of the illumination system, moving the collector or the part of the illuminator. After moving the collector or the part of the illuminator, the method can be repeated.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which:

FIG. 1 schematically depicts a lithographic apparatus, according to an embodiment of the present invention.

Figure 2:
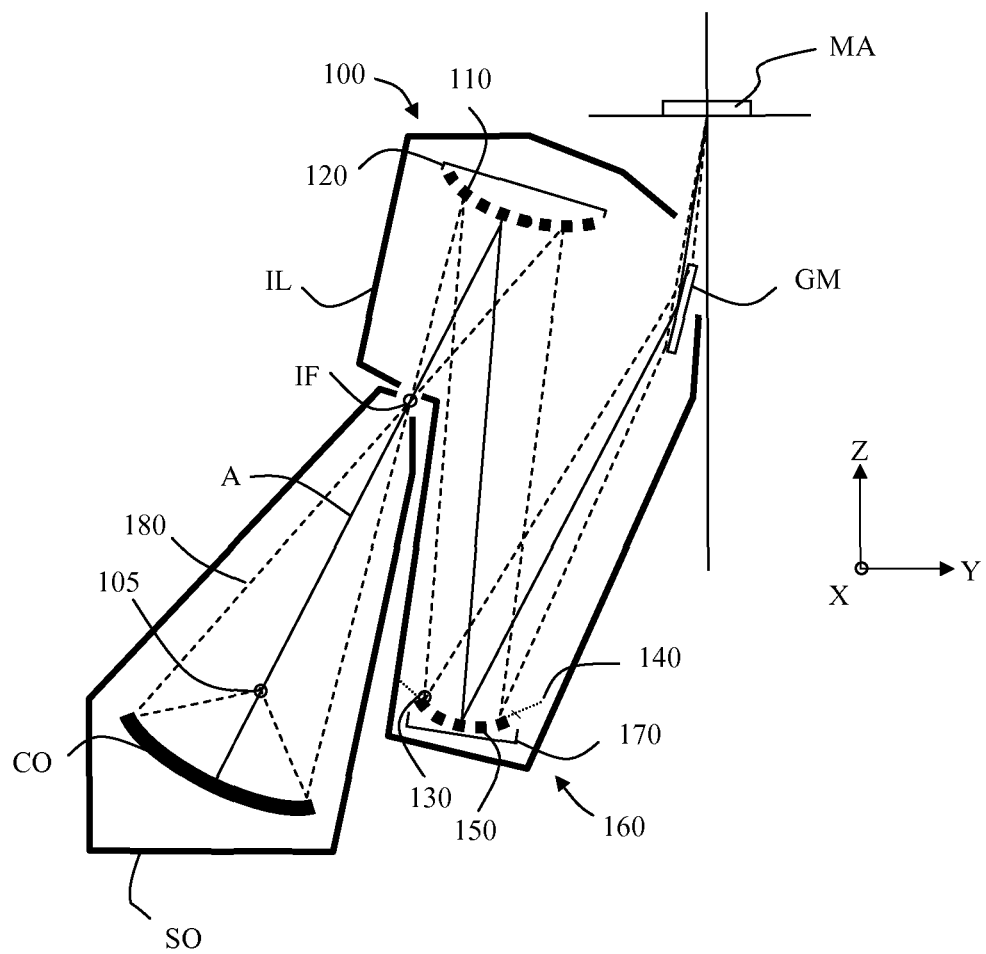

FIG. 2 schematically depicts a source and an illuminator of a lithographic apparatus.

Figure 3:
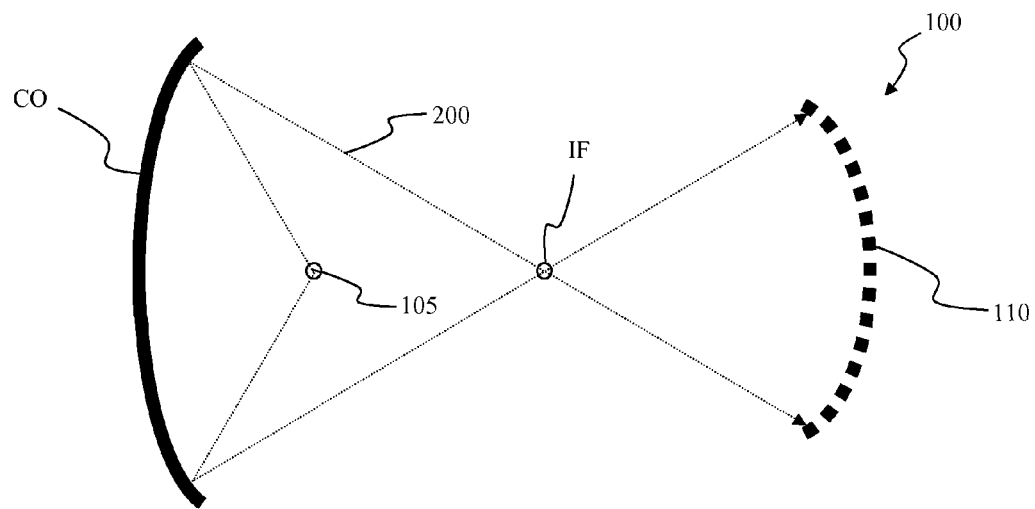

FIG. 3 schematically depicts relative positions of a collector and a faceted optical element of the lithographic apparatus.

Figure 4:
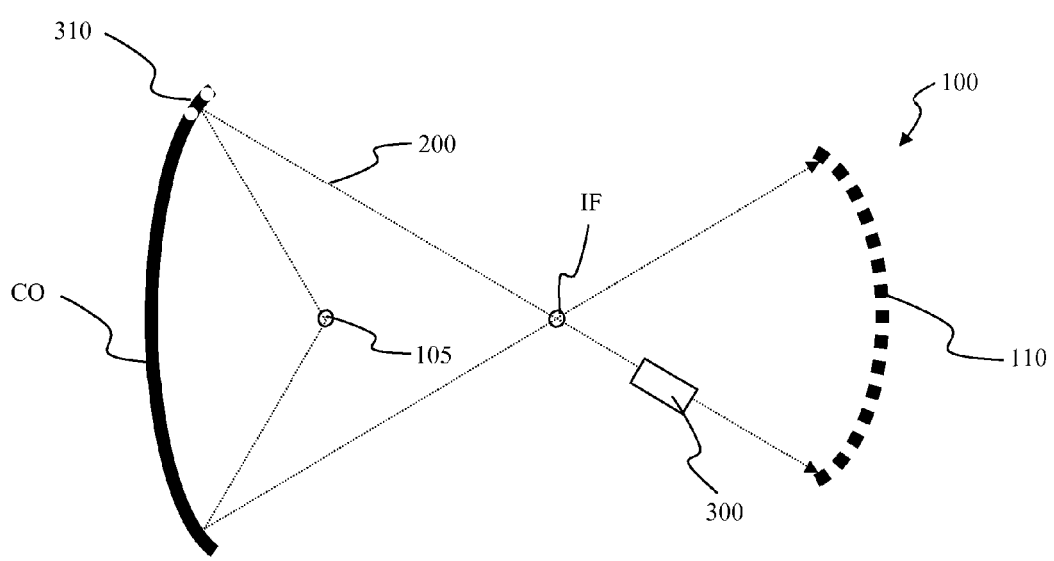

FIG. 4 schematically depicts a collector and a faceted optical element, together with a measurement arrangement, in accordance with an embodiment of the present invention.

FIGS. 5a to 5c schematically depict alternatives for a part of a measurement arrangement in an alignment of a collector in a lithographic apparatus, according to embodiments of the present invention.

FIG. 6 schematically depicts a collector and faceted optical elements, together with a measurement arrangement, in accordance with another embodiment of the present invention.

Figure 7:
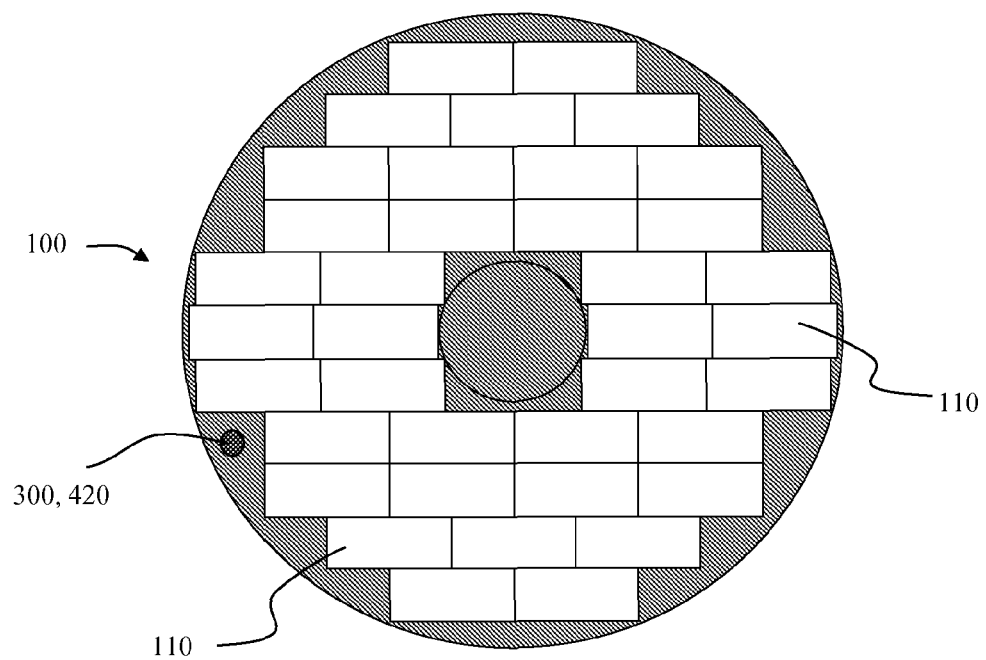

FIG. 7 schematically depicts an alternative configuration for a measurement arrangement, according to an embodiment of the present invention.

Figure 8:
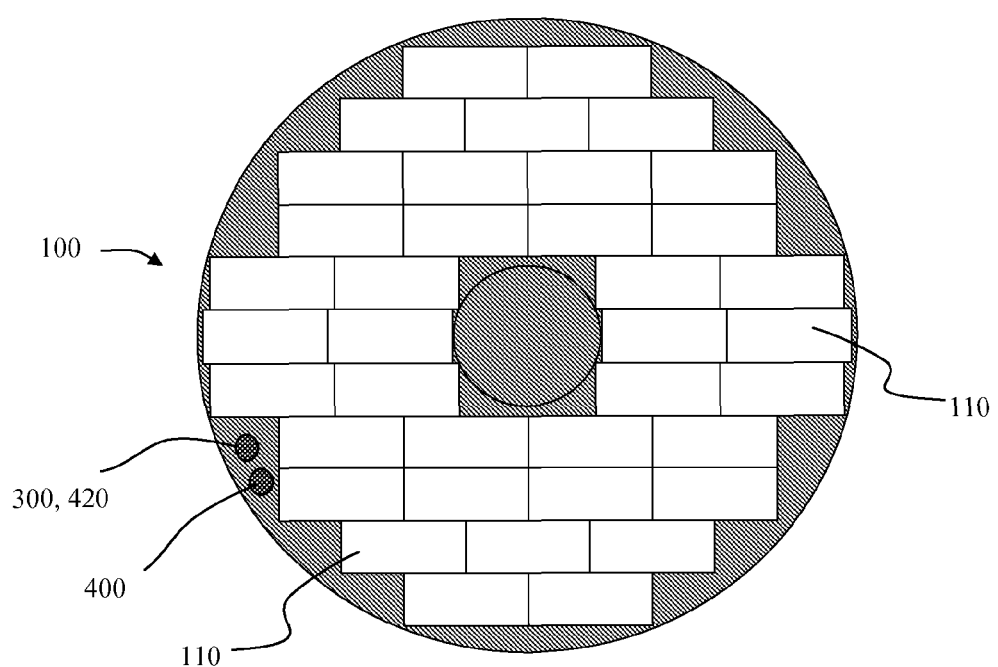

FIG. 8 schematically depicts an alternative configuration for a measurement arrangement according to another embodiment of the present invention Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

In the following description, for purposes of explanation, numerous specific details are set forth in order to provide a thorough understanding of embodiments of the present invention. It will be evident, however, to one skilled in the relevant art that embodiments of the present invention can be practiced without these specific details. In other instances, well-known circuits, structures, and techniques are not shown in detail, but rather in a block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

FIG. 1 schematically depicts a lithographic apparatus 2, according to an embodiment of the present invention. Lithographic apparatus 2 includes the following: an illumination system (illuminator) IL configured to condition a radiation beam B (e.g., EUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and, a projection system (e.g., a refractive projection lens system) PS configured to project a pattern imparted to the radiation beam B by patterning device MA onto a target portion C (e.g., one or more dies) of the substrate W.

The illumination system can include various types of optical components such as, for example, refractive, reflective, magnetic, electromagnetic, electrostatic, or other types of optical components, or any combination thereof, for directing, shaping, or controlling radiation.

The support structure provides support for the patterning device (i.e., bears the weight of the patterning device). It holds the patterning device in a manner that depends on the orientation of the patterning device, the design of lithographic apparatus 2, and other conditions, such as for example whether or not the patterning device is held in a vacuum environment. The support structure can use mechanical, vacuum, electrostatic or other clamping techniques to hold the patterning device. The support structure can be a frame or a table, for example, which can be fixed or movable as required. The support structure can ensure that the patterning device is at a desired position, for example with respect to the projection system. Usage of the terms "reticle" or "mask" herein can be considered synonymous with the more general term "patterning device."

The term "patterning device" used herein should be broadly interpreted as referring to any device that can be used to impart a radiation beam with a pattern in its cross-section such as, for example, to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as for example an integrated circuit. Examples of patterning devices include masks and programmable mirror arrays. Masks are well known in lithography, and typically in an EUV (or beyond EUV) radiation lithographic apparatus would be reflective. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. Usually, in an EUV (or beyond EUV) radiation lithographic apparatus the optical elements will be reflective. However, other types of optical element can be used. The optical elements can be in a vacuum. Any use of the term "projection lens" herein can be considered as synonymous with the more general term "projection system."

Lithographic apparatus 2 can be of a reflective type (e.g., employing a reflective mask). Lithographic apparatus 2 can have two (e.g., dual stage) or more substrate tables (and/or two or more mask tables). In such "multiple stage" configuration, the additional tables can be used in parallel, or preparatory steps can be carried out on one or more tables while one or more other tables are being used for exposure.

Referring to FIG. 1, the illuminator IL receives a radiation beam from a radiation source SO. The source and the lithographic apparatus can be separate entities, where the source is not considered to form part of lithographic apparatus 2 and the radiation beam is passed from the source SO to the illuminator IL with the aid of a beam delivery system. The beam delivery system can include, for example, suitable directing mirrors and/or a beam expander. Alternatively, the source can be an integral part of lithographic apparatus 2. The source SO and the illuminator IL, together with the beam delivery system (if required) can be referred to as a radiation system.

The illuminator IL can include, for example, an adjuster for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can include various other components, such as for example an integrator and a condenser. The illuminator IL can be used to condition the radiation beam B to have a desired uniformity and intensity distribution in its cross-section.

The radiation beam B is incident on the patterning device (e.g., mask MA), which is held on the support structure (e.g., mask table MT) and is patterned by the patterning device. After reflecting off the mask MA, the radiation beam B passes through the projection system PS, which focuses the beam onto a target portion C of the substrate W. With the aid of the second positioner PW and position sensor IF2 (e.g., an interferometric device, linear encoder, or capacitive sensor), the substrate table WT can be moved accurately (e.g., so as to position different target portions C in the path of the radiation beam B). Similarly, the first positioner PM and another position sensor IF1 can be used to accurately position the mask MA with respect to the path of the radiation beam B (e.g., after mechanical retrieval from a mask library, or during a scan). In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner) the mask table MT can be connected to a short-stroke actuator only, or can be fixed. Mask MA and substrate W may be aligned using mask alignment marks M1, M2 and substrate alignment marks P1, P2. Although the substrate alignment marks as illustrated occupy dedicated target portions, they can be located in spaces between target portions (these are known as scribe-lane alignment marks). Similarly, in situations in which more than one die is provided on the mask MA, the mask alignment marks may be located between the dies.

Lithographic apparatus 2 could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as for example a programmable mirror array of a type as referred to above. Combinations and/or variations on the above described modes of use or entirely different modes of use may also be employed.

FIG. 2 shows a more detailed, but still schematic depiction of the illuminator IL and source SO shown in and described with reference to FIG. 1. FIG. 2 shows the beam path of a radiation beam passing through an illuminator IL with two faceted optical elements 100 and 160 in reflective representation. The beam path is schematically indicated by an axis "A." Radiation emitted from an emission point 105 of the radiation source SO is collected by means of a collector mirror CO and converted into a convergent light bundle centered around the axis A. An image of the source SO is located at an intermediate focus IF. A first optical element 100 includes field raster elements 110 that are arranged on a first raster element plate 120. Field raster elements 110 divide the radiation beam impinging on first optical element 100 into a plurality of light channels and create secondary light sources 130 at a surface 140, where pupil raster elements 150 of a second optical element 160 are disposed. Pupil raster elements 150 of second optical element 160 are arranged on a pupil raster element plate 170. The secondary light sources 130 are disposed in a pupil of the illumination system. Optical elements not shown in FIG. 2, downstream of second optical element 160, may serve to image the pupil onto an exit pupil of the illuminator IL (not shown in FIG. 2). An entrance pupil of a projection system coincides with the exit pupil of the illuminator IL (in accordance with so-called "Köhler illumination"). The reflective illuminator IL system can further include optical elements such as, for example, a grazing-incidence field mirror GM, which is constructed and arranged for field-imaging and field-shaping.

Raster elements 110 and 150 of first and second optical elements 100 and 160, respectively, are constructed as mirrors. Raster elements 110 and 150 are arranged on raster element plates 120 and 170, respectively, with a particular orientation (e.g., position and angle of tilt). With a pre-selected orientation (e.g., angle of tilt) of individual field raster elements 110 on field raster element plate 120, it is possible to fix the one-to-one assignment of each element in field raster elements 110 to corresponding pupil raster elements 150 on pupil raster element plate 170.

For reducing non-uniformity of the illumination at the object plane coincident with the mask MA, the assignment of field raster elements 110 to pupil raster elements 150 can differ from an assignment as shown in FIG. 2 by dotted lines 180.

FIG. 3 schematically depicts the collector CO and its position relative to first optical element 100. Radiation 200 is shown as being emitted from emission point 105 and directed by the collector CO towards first optical element 100. It is desirable for the collector CO to direct radiation 200 in a specific direction. It is also desirable that the specific direction is constant during use of the lithographic apparatus so that any element of the lithographic apparatus that is configured to take into account the direction in which radiation 200 is directed can function as intended. As discussed above, it is therefore desirable to provide a method and apparatus which allows for the alignment or re-alignment of the collector CO and the illuminator IL (or, more generally, a part of the illuminator IL) so that the radiation is focused in a specific direction.

Exemplary Alignment of Collector Device in Lithography Apparatus

FIG. 4 schematically depicts the collector CO and first optical element 100, according to an embodiment of the present invention. FIG. 4 also schematically depicts a measurement arrangement 300 and 310 for use in aligning the collector CO with, in this example, first optical element 100. The measurement arrangement includes a detector 300 and a region 310 located on the collector CO, which can affect the direction or re-direction of radiation 200. Radiation 200 can be incident upon region 310.

Detector 300 can have a fixed position relative to the part of the illuminator IL with which the collector CO is to be aligned. In this case, detector 300 has a fixed positional relationship with first optical element 100. The fixed positional relationship can be ensured by, for example, mounting detector 300 to first optical element 100 or by separately mounting detector 300 and first optical element 100. This ensures that the relative positions of detector 300 and first optical element 100 do not change with respect to one another.

In use, radiation 200 is emitted from emission point 105. The collector CO collects radiation 200 and re-directs it towards first optical element 100. A portion of radiation 200 emitted from emission point 105 is incident upon region 310. Changes in radiation 200 incident upon region 310 can be measured by detector 300. For instance, region 310 and detector 300 can be configured such that radiation 200 is incident on region 310 and reflected toward detector 300. By measuring changes in the radiation affected by region 310, information indicative of the orientation of the collector CO can be obtained.

FIGS. 5a to 5c schematically depict a part of the collector CO, and alternative configurations of the region affecting the re-direction of incident radiation, according to embodiments of the present invention.

FIG. 5a shows a region 320 located on the collector CO. In an embodiment, region 320 has a reduced reflectivity with respect to a remaining surface of the collector CO. Thus, the intensity of radiation reflected from this reduced reflectivity region 320 can be reduced in comparison with radiation incident upon other surfaces of the collector CO. In referring to FIG. 4, such reduction in intensity can be detected by detector 300. Referring to FIGS. 4 and 5a in combination, region 320 therefore can cause a reduced intensity region to be imaged onto and detected by detector 300. Movement of the collector CO will result in movement of region 320 and thus consequential movement of the reduced intensity region on detector 300. Such movement can be detected using, for example, an array of detecting elements on detector 300. In summary, information at least indicative of the position and/or orientation of the collector CO relative to detector 300 (and, therefore the illuminator IL) can be obtained by detecting movement of the reduced intensity region using detector 300.

Although a reduced reflectivity region 320 has been described, other configurations are possible. FIG. 5b shows that a region of the collector CO can be provided with a hole or aperture 330. Aperture 330 can result in a reduction in intensity of radiation incident upon this region of the collector CO and a corresponding radiation directed towards detector 300. In a similar manner to that described above in relation to FIG. 5a, such a reduction in intensity in radiation reflected from the region provided with aperture 330 can be detected by detector 300. Movement of this reduced intensity region can be detected and used to determine information at least indicative of the position and/or orientation of the collector CO relative to detector 300 (and, therefore the illuminator IL).

FIG. 5c shows that a region of the collector CO can be provided with a pattern 340. For example, pattern 340 can include regions of different reflectivity configured to affect the reflection of radiation incident upon pattern 340. Radiation re-directed by pattern 340 towards detector 300 can be detected and thus movement of pattern features (e.g., regions of different intensity) on detector 300 can be detected and used to determine information at least indicative of the position and/or orientation of the collector CO relative to detector 300 (and, therefore the illuminator IL).

The region provided on, or attached to the collector can have features or functionality other than that described in relation to FIGS. 5a to 5c. For instance, the region can have an increased reflectivity with respect to remaining surface of the collector CO. Thus, the intensity of radiation reflected from this increased reflectivity region can be greater than radiation reflected from other parts of the collector. Such increase in intensity can be detected by detector 300, and the movement of a region with increased intensity can be detected by detector 300. In general, detector 300 can be arranged to detect a change of a characteristic of the portion of radiation re-directed by the region, where the change can be indicative of a change in a position or orientation of the collector CO relative to the part of the illumination system in which the collector is aligned to. This characteristic can be, for example, a change in the detected intensity, a change in the detected wavelength, a change in the detected frequency, or a change in the detected pattern. Once information that is at least indicative of the position and/or orientation of the collector CO has been obtained, the information can be used to align the collector CO with an optical element (e.g., first optical element 100 in FIG. 2) or, in general, a reference point in or on the illuminator IL which detector 300 has a fixed positional relationship with. The collector CO, or a housing or the like in which the collector CO is located, can be moved in order to align the collector CO with the optical element. Alternatively or additionally, a part of the illuminator IL can be moved in order to bring the collector CO into alignment with that part. Such movement can be undertaken by any appropriate actuation arrangement such as, for example, a linear actuator, a piezoelectric actuator, and a stepper motor. The collector CO can be correctly aligned by ensuring that detector 300 detects, for example, a reduced intensity region in a particular location. The particular location in which the reduced intensity region is detected by detector 300 can correspond to a desired alignment configuration of collector 300 and the optical element.

A person skilled in the relevant art will appreciate, from a review of FIGS. 4, 5a, 5b, and 5c, that no additional radiation source is required to align the collector CO with the optical element (or, in general, another reference point in or on the illuminator IL which detector 300 has a fixed positional relationship with). Instead, radiation emitted from an emission point (e.g., emission point 105 in FIG. 4) is used to align the collector CO with an optical element (e.g., first optical element 100 in FIG. 4). Furthermore, no LEDs or the like need to be located on the collector CO in order to align the collector CO with the optical element. In turn, this reduces costs associated with the purchase and maintenance of such LEDs and also avoids a need to regularly replace the LEDs due to damage suffered in the harsh environment surrounding the collector CO. As discussed above, in known arrangements, it can be difficult to position LEDs on a collector and to maintain a certain degree of accuracy in that position, thus affecting the alignment accuracy of the collector. Since embodiments of the present invention do not rely upon the use of LEDs attached to the collector, such problems are avoided and the accuracy with which alignment of the collector may be undertaken can be improved.

FIG. 6 schematically depicts the collector CO and the first optical element 100, together with a measurement arrangement 400, 410, and 420, in accordance with another embodiment of the present invention. Measurement arrangement 400, 410, and 420 can include a radiation source 400, which may be, for example, an LED or the like. The radiation source 400 may also be referred to as the "further radiation source" or the "additional radiation source" to differentiate from the emission point 105 of the EUV radiation source. Radiation source 400 is configured to emit a radiation 405 and to direct radiation 405 towards a region 410 located on a periphery of the collector CO. Region 410 can be configured to reflect radiation 405 towards detector 420. In this embodiment, detector 420 can be located adjacent to radiation source 400. Information at least indicative of the position and/or orientation of the collector CO can be obtained by detecting radiation 405 reflected from region 410 (located on the periphery of the collector).

In an embodiment, region 410 can have an increased reflectivity with respect to a remaining surface of the collector CO. For instance, region 410 can be a polished region of the collector CO. Alternatively or additionally, region 410 can take the form of any one of the regions described above in relation to FIGS. 5a to 5c. In general, region 410 is configured such that a movement of the collector CO causes a change in a reflection of radiation 405 by region 410. As such, this change in the reflection can be detected and used to obtain information at least indicative of the position and/or orientation of the collector CO. The change could be positional such as, for example, a change in the position of a reduced or increased intensity region. In another example, the change can be a change in the nature of a pattern reflected onto the detector. In general, the detector can be configured to detect a change of a characteristic of the portion of radiation re-directed by region 410, where the change is indicative of a change in a position or orientation of the collector CO relative to the part of the illumination system in which the collector is aligned to. This characteristic can be, for example, a change in the detected intensity, a change in the detected wavelength, a change in the detected frequency, or a change in the detected pattern.

In an embodiment, detector 420 and/or radiation source 400 is located in a fixed position relative to first optical element 100 (or, in general, a part of the illuminator IL relative to which alignment is to be undertaken). This is so that alignment of the collector CO relative to that part of the illuminator IL can be undertaken. Alignment of the collector CO can be undertaken as described above, for example, by using an actuation arrangement to move the collector CO, or a housing in which the collector CO is located, or a part of the illuminator IL relative to which the collector CO is to be aligned.

The embodiment shown in and described with reference to FIG. 6 is advantageous in comparison with known arrangements. This is because no LEDs or the like are required to be located on the collector in order to align it with the an optical element. This avoids the need to regularly replace LEDs due to damage suffered in the harsh environment surrounding the collector. As discussed above, in known arrangements, it may be difficult to position LEDs on a collector and maintain a certain degree of accuracy of that position. This could affect the accuracy in which alignment of the collector can be undertaken. Since embodiments of the present invention do not rely upon the use of LEDs attached to the collector, such problems are avoided and the accuracy of collector alignment can be improved.

In the above embodiments, it has been described how a detector can, for example, be located in a position which is fixed relative to a part of an illuminator relative to which alignment is to be undertaken (e.g., first optical element 100 in FIGS. 2-6). FIGS. 7 and 8 schematically depict plan views of first optical element 100. If the above embodiments are to be implemented, the detector is preferably located in a position which is fixed relative to the optical element 100. FIG. 7 shows an example of how this may be achieved, where detector 300, 420 can be located on first optical element 100. Detector 300, 420 can be located in a part of first optical element 100 which does not control properties of the radiation beam reflected from first optical element 100. For instance, in an embodiment, detector 300, 420 can be located on a periphery of first optical element 100, and not on or in field raster element 110. Radiation can still nevertheless be incident upon detector 300, 420 and therefore the embodiments shown in and described with reference to FIGS. 4, 5*a*, 5*b*, and 5*c* can be implemented using the configuration shown in FIG. 7.

In another embodiment of FIG. 7, an additional radiation source can be used in the alignment of the collector. FIG. 8 shows a radiation source 400 located on first optical element 100 in a position which does not affect the reflection of the radiation beam from first optical element 100 according to an embodiment of the present invention. Radiation source 400 can be located on the periphery of first optical element 100 and not located in or on a field raster element 110.

Referring to FIGS. 7 and 8 in combination, by locating detector 300, 420 on an object relative to which the collector is to be aligned (e.g., the first optical element 100) a fixed positional relationship between the detector and the object relative to which alignment is to be undertaken is achieved. FIG. 8 shows that radiation source 400 can be located on the object relative to which alignment of the collector is to be undertaken. A fixed positional relationship between radiation source 400 and the object relative to which alignment of the collector is to be undertaken can be advantageous in lithography applications. As a person skilled in the relevant will appreciate, detector 300, 420 and/or radiation source 400 can be located beside or above first optical element 100.

The detectors and radiation sources described so far have been described as being in a fixed positional relationship with a part of the illuminator relative to which the collector is to be aligned. The detectors and/or the radiation sources can be located within, and/or attached to the illuminator or the part of the illuminator.

The embodiments described above can be combined. Radiation emitted from the emission point can be used to align the collector relative to the illuminator, and also radiation generated by a further radiation source and directed toward the collector may also be used to align the collector. Here, one or more detectors can be used. The combination of the embodiments described above can lead to an accurate alignment of the collector or can provide redundancy if one of the measurement arrangements malfunction.

In the above embodiments, the collector that has been described is formed by, for example, a concave reflective surface. In embodiments where an additional radiation source is used to direct radiation at a region of the collector and a detector is then used to detect changes in radiation reflected from this region (e.g., see description of FIG. 6), the collector can also be, for example, a grazing incidence collector. The region can be a part of, or attached to, a constituent part of the grazing incidence collector.

In all of the described embodiments, the regions that have been described as affecting the direction of radiation incident upon those regions can form part of the collector or may be attached to the collector. The regions can be located on or attached to a periphery of the collector.

In the above embodiments, only a single detector has been described. Additional and/or more accurate positional and/or orientation information can be obtained by using, for example, more than one detector (e.g., three detectors). Alternatively or additionally, additional and/or more accurate positional and/or orientation information can be obtained by using, for example, more than one region (e.g., three regions). A detector can be provided for each region, and a plurality of such region-detector pairings can be provided.

The alignment of the collector relative to the illuminator can be undertaken at any appropriate time. For instance, in an embodiment, the alignment can be undertaken during a calibration routine undertaken in respect of a part of, or all of, the lithographic apparatus. The alignment can be undertaken when the lithographic apparatus has not been used to apply a pattern to a substrate. The alignment can be undertaken when a lithographic apparatus is actuated for the first time, or after a period of prolonged inactivity. The alignment can be undertaken when, for example, parts of the collector or illuminator are replaced or removed (e.g., during a maintenance routine or the like). In an embodiment, a method of aligning the collector and a part of the illumination system can include the following: detecting radiation directed from the region with which the collector is provided; determining from that detection whether the collector is aligned with the part of the illumination system; and, if the collector is not aligned with the part of the illumination system, moving the collector or the part of the illuminator. After moving the collector or the part of the illuminator, the method can be repeated.

Although the above description of embodiments of the invention relates to a radiation source which generates EUV radiation (e.g., 5-20 nm), the invention may also be embodied in a radiation source which generates radiation having a different wavelength. For example, the radiation source may generate 'beyond EUV' radiation (e.g., radiation with a wavelength of less than 10 nm). Beyond EUV radiation can have, for example, a wavelength of 6.7 nm or 6.8 nm. A radiation source which generates beyond EUV radiation can operate in the same manner as the radiation sources described above.

While various embodiments of the present invention have been described above, it should be understood that they have been presented by way of example, and not limitation. It will be apparent to persons skilled in the relevant art(s) that various changes can be made therein without departing from the scope of the invention. Furthermore, it should be appreciated that the detailed description of the present invention provided herein, and not the summary and abstract sections, is intended to be used to interpret the claims. The summary and abstract sections can set forth one or more but not all exemplary embodiments of the present invention as contemplated by the inventors.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

What is claimed is:

1. A lithographic apparatus, comprising:
   a radiation source configured to provide radiation;
   a radiation collector including a first region and a second region, the first region comprising a first optical characteristic and the second region comprising a second optical characteristic the first and second optical characteristics being different from each other, wherein the first region and the second region each is configured to collect at least a portion of the radiation from the radiation source;

an illumination system configured to condition radiation collected by the first region of the radiation collector and to provide a radiation beam, wherein the radiation collector is configured to be aligned with a part of the illumination system; and a detector configured to be in a fixed positional relationship with the part of the illumination system and to detect a change of a characteristic of radiation collected by the second region of the radiation collector, wherein the detected change is indicative of a change in a position or orientation of the radiation collector relative to the part of the illumination system with respect to which the radiation collector is configured to be aligned.

2. The lithographic apparatus of claim 1, wherein the radiation collected by the first region of the radiation collector traverses a collector surface having a reflectivity, and wherein the second region comprises at least one of:

a surface having an increased reflectivity relative to the reflectivity;

a surface having a reduced reflectivity relative to the reflectivity;

an aperture; and a pattern comprising a plurality of regions, each region of the plurality of regions having a reflectivity different from other regions of the plurality of regions.

3. The lithographic apparatus of claim 1, wherein the second region is a part of the radiation collector, or is attached to the radiation collector.

4. The lithographic apparatus of claim 1, wherein the detector is one of attached to, located on, or located within the part of the illumination system relative to which the radiation collector is configured to be aligned.

5. The lithographic apparatus of claim 1, wherein the illumination system comprises an optical element having raster elements, the raster elements being configured to divide the radiation beam impinging on the optical element into light channels, and wherein the detector is one of attached to or forms part of the optical element.

6. The lithographic apparatus of claim 1, wherein the second region is configured to affect at least one of:

an intensity profile of radiation directed by the second region toward the detector; and direction in which the radiation is directed by the second region toward the detector.

7. The lithographic apparatus of claim 1, wherein the second region is configured to affect radiation directed by the second region toward the detector when the position or orientation of the radiation collector changes with respect to the part of the illumination system relative to which the radiation collector is configured to be aligned.

8. The lithographic apparatus of claim 1, further comprising:

a support configured to support a patterning device, the patterning device being capable of imparting the radiation beam with a pattern in its cross-section to form a patterned radiation beam;

a substrate table configured to hold a substrate; and a projection system configured to project the patterned radiation beam onto a target portion of the substrate.

9. A lithographic apparatus, comprising:

a first radiation source configured to provide a first radiation;

a radiation collector including a first region and a second region, the first region comprising a first optical characteristic and the second region comprising a second optical characteristic, the first and second optical characteristics being different from each other, wherein the first region is configured to collect at least a portion of the first radiation;

an illumination system configured to condition radiation collected by the first region of the radiation collector and to provide a radiation beam, wherein the radiation collector is configured to be aligned with a part of the illumination system;

a second radiation source configured to provide a second radiation, wherein the second region is configured to collect at least a portion of the second radiation; and a detector configured to be in a fixed positional relationship with the part of the illumination system and to detect a change of a characteristic of the second radiation that is directed toward the detector by the second region, wherein the detected change is indicative of a change in a position or orientation of the radiation collector relative to the part of the illumination system with respect to which the radiation collector is configured to be aligned.

10. The lithographic apparatus of claim 9, wherein the second radiation source is one of attached to, located on, or located within the part of the illumination system relative to which the radiation collector is configured to be aligned.

11. The lithographic apparatus of claim 9, wherein the first radiation collected by the first region of the radiation collector traverses a collector surface having a reflectivity, and wherein the second region comprises at least one of:

a surface having an increased reflectivity relative to the reflectivity;

a surface having a reduced reflectivity relative to the reflectivity;

an aperture; and a pattern comprising a plurality of regions, each region of the plurality of regions having a reflectivity different from other regions of the plurality of regions.

12. The lithographic apparatus of claim 9, wherein the second region is a part of the radiation collector, or is attached to the radiation collector.

13. The lithographic apparatus of claim 9, wherein the detector is one of attached to, located on, or located within the part of the illumination system relative to which the radiation collector is configured to be aligned.

14. The lithographic apparatus of claim 9, wherein the illumination system comprises an optical element having raster elements, the raster elements being configured to divide the radiation beam impinging on the optical element into light channels, and wherein the detector is one of attached to, or forms part of the optical element.

15. The lithographic apparatus of claim 9, wherein the region is arranged to affect one of:

an intensity profile of the second radiation directed toward the detector; and direction in which the second radiation is directed toward the detector.

16. The lithographic apparatus of claim 9, wherein the second region is configured to affect the second radiation directed toward the detector when the position or orientation of the radiation collector changes with respect to the part of the illumination system relative to which the radiation collector is configured to be aligned.

17. The lithographic apparatus of claim 9, further comprising:
- a support configured to support a patterning device, the patterning device being capable of imparting the radiation beam with a pattern in its cross-section to form a patterned radiation beam;
- a substrate table configured to hold a substrate; and
- a projection system configured to project the patterned radiation beam onto a target portion of the substrate.

18. A method of aligning a radiation collector and a part of the illumination system, the method comprising:
- detecting a direction of radiation directed from a region of the radiation collector, the region having an optical characteristic different from another region of the radiation collector, the another region being configured to collect at least a portion of radiation from a radiation source;
- determining, using the detected direction, misalignment of the radiation collector with respect to the part of the illumination system; and
- moving the radiation collector or the part of the illumination system in response to the radiation collector being misaligned with respect to the part of the illumination system.

19. The method of claim 18, wherein the method is repeated after moving the radiation collector or the part of the illumination system.

* * * * *